United States Patent
Chang et al.

(10) Patent No.: US 8,580,485 B2
(45) Date of Patent: Nov. 12, 2013

(54) METHOD FOR FORMING THREE-DIMENSIONAL PATTERN

(75) Inventors: Chien-Min Chang, Taipei (TW); Jung-Chin Wu, Taipei (TW); Wan-Li Chuang, Taipei (TW)

(73) Assignee: Compal Electronics, Inc., Taipei (TW)

( * ) Notice: Subject to any disclaimer, the term of this patent is extended or adjusted under 35 U.S.C. 154(b) by 273 days.

(21) Appl. No.: 12/944,739

(22) Filed: Nov. 12, 2010

(65) Prior Publication Data

US 2011/0183270 A1    Jul. 28, 2011

Related U.S. Application Data

(60) Provisional application No. 61/298,913, filed on Jan. 28, 2010.

(51) Int. Cl.
*G03F 7/26* (2006.01)

(52) U.S. Cl.
USPC .......................................................... 430/322

(58) Field of Classification Search
USPC .......................................................... 430/322
See application file for complete search history.

(56) References Cited

U.S. PATENT DOCUMENTS

| 4,897,325 A * | 1/1990 | Akkapeddi et al. ............... 430/5 |
| 2009/0197116 A1* | 8/2009 | Cheng et al. ................... 428/651 |
| 2010/0015409 A1* | 1/2010 | Hamilton et al. ........... 428/195.1 |

FOREIGN PATENT DOCUMENTS

| TW | 504769 | * 10/2002 |
| TW | 532560 | 5/2003 |
| TW | 200538885 | 12/2005 |
| TW | 200830364 | 7/2008 |
| TW | 200945977 | 11/2009 |

OTHER PUBLICATIONS

"Office Action of Taiwan Counterpart Application", issued on Jul. 25, 2012, p. 1-p. 6.

* cited by examiner

*Primary Examiner* — Kathleen Duda
*Assistant Examiner* — Caleen Sullivan
(74) *Attorney, Agent, or Firm* — Jianq Chyun IP Office

(57) ABSTRACT

A method for forming a three-dimensional pattern includes following steps. A shaped workpiece having an inner surface and an outer surface is provided, and a first photoresist layer and a second photoresist layer are respectively formed on the outer surface and the inner surface. The shaped workpiece is placed on a transparent fixture. The first photoresist layer and the second photoresist layer are exposed and developed, such that the first photoresist layer forms a patterned photoresist layer, and the second photoresist layer forms an etching protection layer. The shaped workpiece is etched to form the three-dimensional pattern on the outer surface of the shaped workpiece. The patterned photoresist layer and the etching protection layer are removed.

7 Claims, 3 Drawing Sheets ial application Ser. No. 61/298,913, filed on Jan. 28, 2010.

METHOD FOR FORMING THREE-DIMENSIONAL PATTERN

CROSS-REFERENCE TO RELATED APPLICATION

This application claims the priority benefit of U.S. provisional application Ser. No. 61/298,913, filed on Jan. 28, 2010. The entirety of the above-mentioned patent application is hereby incorporated by reference herein and made a part of this specification.

BACKGROUND OF THE INVENTION

1. Field of the Invention

The invention relates to a method for forming a three-dimensional pattern. More particularly, the invention relates to a method for forming a three-dimensional pattern on a shaped workpiece.

2. Description of Related Art

At present, exterior components of electronic devices (e.g. notebook computers, mobile phones, and digital cameras) are often made of metallic materials. Various patterns embellishing the entire electronic device are frequently formed on the exterior components to draw consumers' attention. Laser carving has been applied to form the patterns on a surface of the metallic shaped workpiece, while the quality of carving is affected every now and then by the outline of the shaped workpiece. For instance, depth of the patterns of the shaped workpiece often gives rise to difficulty in focusing laser beams during caving, such that the patterns are far from being delicate, the patterns are too shallow, or the outline of the patterns is too indistinct.

SUMMARY OF THE INVENTION

The invention is directed to a method for forming a three-dimensional pattern, so as to form the three-dimensional pattern on a shaped workpiece.

In an embodiment of the invention, a method for forming a three-dimensional pattern is provided. According to the method, a shaped workpiece having an inner surface and an outer surface is provided, and a first photoresist layer and a second photoresist layer are respectively formed on the outer surface and the inner surface. The shaped workpiece is placed on a transparent fixture. The first photoresist layer and the second photoresist layer are exposed and developed, such that the first photoresist layer forms a patterned photoresist layer, and the second photoresist layer forms an etching protection layer. The shaped workpiece is etched to form the three-dimensional pattern on the outer surface of the shaped workpiece. The patterned photoresist layer and the etching protection layer are removed.

Based on the above, the shaped workpiece described in the above embodiment of the invention has the etching protection layer disposed on the inner surface of the shaped workpiece, so as to protect the inner surface during the etching process. In addition, the shaped workpiece is equipped with a flexible exposure mask which is adapted to the surface profile of the shaped workpiece, such that the flexible exposure mask is well attached to the photoresist layer at the outer surface of the shaped workpiece. Thereby, in the exposure process, the development process, and the etching process that are subsequently performed, the three-dimensional pattern can be successfully formed on the outer surface of the shaped workpiece.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
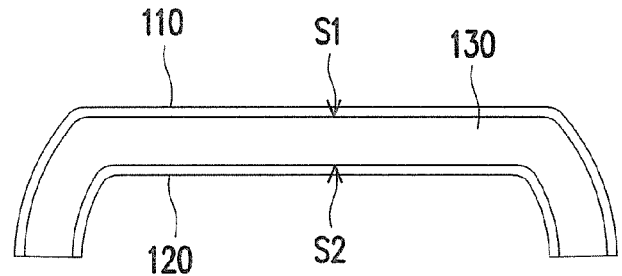
FIG. 1 to FIG. 8 are schematic views illustrating a method for forming a three-dimensional pattern according to an embodiment of the invention.

FIG. 1 to FIG. 8 are schematic views illustrating a method for forming a three-dimensional pattern according to an embodiment of the invention. As shown in FIG. 1, a shaped workpiece 130 is provided in the embodiment, and the shaped workpiece 130 serves as an exterior component of an electronic device (not shown). The shaped workpiece 130 has an outer surface S1 and an inner surface S2 facing against the outer surface S1. The outer surface S1 is a convex surface, and the inner surface S2 is a concave surface. In other words, the shaped workpiece 130 can be a three-dimensional housing formed by punching or bending a flattened housing. Note that the present embodiment is not limited to said conditions.

A first photoresist layer 110 and a second photoresist layer 120 are respectively formed on the outer surface S1 and the inner surface S2 of the shaped workpiece 130. How the first and the second photoresist layers 110 and 120 are formed on the shaped workpiece 130 is not limited in this embodiment. To form the first and the second photoresist layers 110 and 120 respectively on the outer surface S1 and the inner surface S2 of the shaped workpiece 130, the shaped workpiece 130 can be soaked in liquid photoresist, or the liquid photoresist can be sprayed on the surfaces of the shaped workpiece 130. Other methods, if appropriate, are also applicable for forming the first and the second photoresist layers 110 and 120 on the outer surface S1 and the inner surface S2 of the shaped workpiece 130, respectively.

Figure 2:
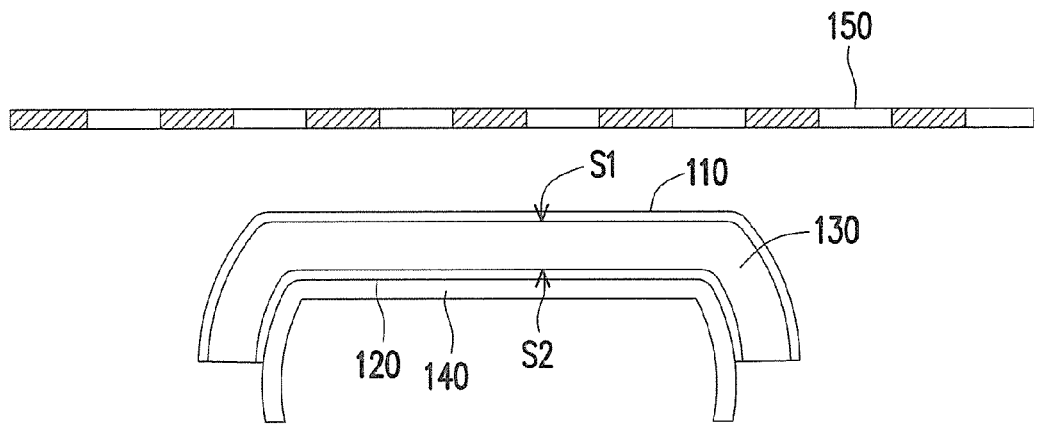
Figure 3:
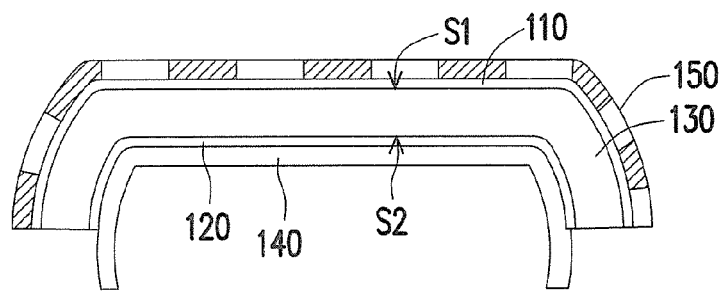

With reference to FIG. 2 and FIG. 3, the shaped workpiece 130 on which the first and the second photoresist layers 110 and 120 are formed is disposed and positioned on a fixture 140. A flexible exposure mask 150 is provided, and the flexible exposure mask 150, for example, is a thin film made of a flexible material (TPU, PET, PC, CPP, OPP, and so on). After the flexible exposure mask 150 is placed above the shaped workpiece 130 and aligned to the outer surface S1 of the shaped workpiece 130, the flexible exposure mask 150 is attached to the outer surface S1 of the shaped workpiece 130 by vacuum suction, so as to cover a portion of the first photoresist layer 110. Here, gaps possibly existing between the flexible exposure mask 150 and the outer surface S1 of the shaped workpiece 130 can be removed by vacuum suction, such that the flexible exposure mask 150 can be well attached to the first photoresist layer 110 of the shaped workpiece 130.

Figure 4:
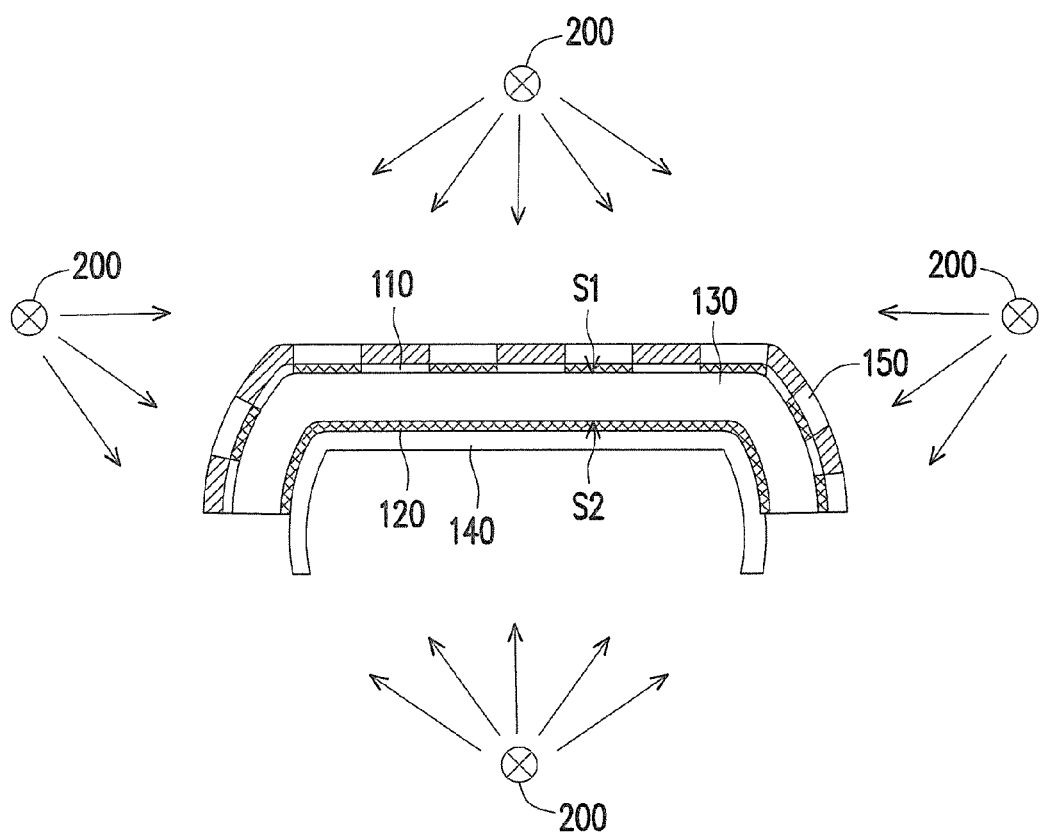

As indicated in FIG. 4, an exposure process is performed on the shaped workpiece 130 to cause chemical reaction of the portion of the first photoresist layer 110 exposed by the flexible exposure mask 150 due to implementation of the exposure process. Note that a material of the fixture 140, e.g. a transparent PC or an acrylic material, allows light to pass. Thereby, when the exposure process is performed on the first photoresist layer 110 with use of an exposure light source

200, light from the exposure light source 200 can pass through the fixture 140 and arrive at the second photoresist layer 120 located on the inner surface S2 of the shaped workpiece 130, such that the second photoresist layer 120 is completely exposed.

In the exposure process described in this embodiment, the exposure light source 200 is capable of providing ultraviolet to expose the first and the second photoresist layers 110 and 120, which is however not limited in this embodiment. Moreover, the flexible exposure mask 150 can also be made of an ultraviolet-resistant and abrasion-resistant material which is not apt to be deformed.

Figure 5:
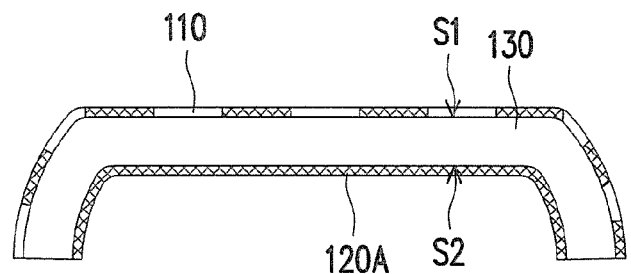
Figure 6:
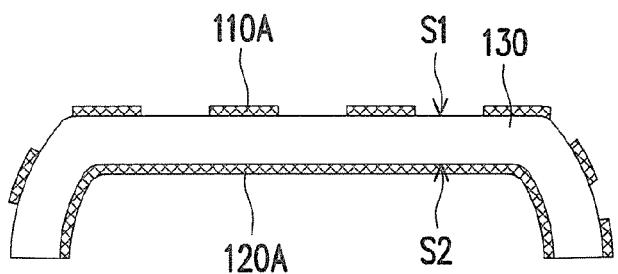

After the exposure process depicted in FIG. 4 is completed, a development process is implemented as shown in FIG. 5 and FIG. 6. Specifically, a developer (not shown) is used to dissolve and remove the unexposed portion of the first photoresist layer 110 as shown in FIG. 5, while the exposed portion of the first photoresist layer 110 is left to form a patterned photoresist layer 110A. Meanwhile, the second photoresist layer 120 does not react with the developer and can still be attached to the inner surface S2 because the second photoresist layer 120 is completely exposed.

However, in the previous embodiment, positive liquid photoresist is used to form the first and second photoresist layers, and therefore the portion that is exposed and not covered by the flexible exposure mask can be dissolved and removed by the developer. By contrast, the first photoresist layer can also be made by negative liquid photoresist, and the developer is used to dissolve the unexposed portion of the first photoresist layer.

Figure 7:
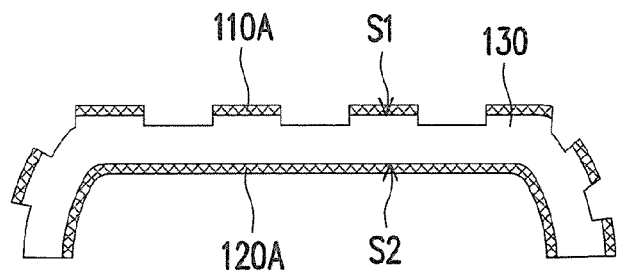
Figure 8:
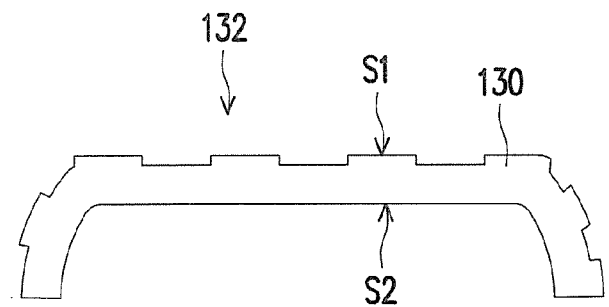

With reference to FIG. 7 and FIG. 8, the shaped workpiece 130 is etched. According to this embodiment, a method of etching the shaped workpiece 130 is wet etching, and the outer surface S1 of the shaped workpiece 130 is etched by taking the patterned photoresist layer 110A as an etching mask. It should be mentioned that the second photoresist layer 120 on which the exposure process and the development process are performed becomes an etching passivation layer 120A, so as to protect the inner surface S2 of the shaped workpiece 130.

After the outer surface S1 of the shaped workpiece 130 is completely etched, the etching passivation layer 120A and the patterned photoresist layer 110A located on the shaped workpiece 130 are removed. The three-dimensional pattern 132 is then completely formed on the shaped workpiece 130.

In light of the foregoing, the shaped workpiece described in the above embodiment of the invention has the etching protection layer disposed on the inner surface of the shaped workpiece, so as to protect the inner surface during the etching process. In addition, the shaped workpiece is equipped with the flexible exposure mask which is adapted to the surface profile of the shaped workpiece, such that the flexible exposure mask is well attached to the photoresist layer at the outer surface of the shaped workpiece. Thereby, in the exposure process, the development process, and the etching process that are subsequently performed, the three-dimensional pattern can be successfully formed on the outer surface of the shaped workpiece.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method for forming a three-dimensional pattern, the method comprising:
   providing a shaped workpiece having an inner surface and an outer surface, a first photoresist layer and a second photoresist layer being respectively formed on the outer surface and the inner surface;
   disposing and positioning the shaped workpiece on a transparent fixture, wherein a profile of the transparent fixture matches a profile of the inner surface;
   exposing and developing the first photoresist layer and the second photoresist layer, such that the first photoresist layer forms a patterned photoresist layer, and the second photoresist layer forms an etching protection layer, wherein an exposure light provided by an exposure light source passes through the entire transparent fixture, and the second photoresist layer formed on the inner surface entirely is completely exposed;
   etching the shaped workpiece to form the three-dimensional pattern on the outer surface of the shaped workpiece; and
   removing the patterned photoresist layer and the etching protection layer.

2. The method for forming the three-dimensional pattern as claimed in claim 1, wherein the first photoresist layer is exposed by using a flexible exposure mask.

3. The method for forming the three-dimensional pattern as claimed in claim 2, wherein the flexible exposure mask is closely adhered to the first photoresist layer by vacuum suction.

4. The method for forming the three-dimensional pattern as claimed in claim 1, wherein the first photoresist layer and the second photoresist layer are exposed simultaneously.

5. The method for forming the three-dimensional pattern as claimed in claim 1, wherein the first photoresist layer and the second photoresist layer are developed simultaneously.

6. The method for forming the three-dimensional pattern as claimed in claim 1, wherein a material of the shaped workpiece is metal formed by performing a punching process.

7. The method for forming the three-dimensional pattern as claimed in claim 1, wherein the shaped workpiece is a three-dimensional housing.

* * * * *